U S 0 1 0 3 0 5 0 3 8 B 1

United States Patent
Hiruoka

(10) Patent No.: US 10,305,038 B1
(45) Date of Patent: May 28, 2019

(54) MANUFACTURING METHOD

(71) Applicant: Sharp Kabushiki Kaisha, Sakai, Osaka (JP)

(72) Inventor: Masaki Hiruoka, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 15/761,823

(22) PCT Filed: Apr. 28, 2017

(86) PCT No.: PCT/JP2017/016887
§ 371 (c)(1),
(2) Date: Mar. 21, 2018

(87) PCT Pub. No.: WO2018/198303
PCT Pub. Date: Nov. 1, 2018

(51) Int. Cl.
| | |
|---|---|
| *H01L 51/00* | (2006.01) |
| *H01L 27/32* | (2006.01) |
| *H01L 51/56* | (2006.01) |
| *H01L 51/52* | (2006.01) |

(52) U.S. Cl.
CPC ...... *H01L 51/0005* (2013.01); *H01L 27/3244* (2013.01); *H01L 51/5253* (2013.01); *H01L 51/56* (2013.01); *H01L 2227/323* (2013.01)

(58) Field of Classification Search
CPC .............................. H01L 51/005; B05D 1/26
See application file for complete search history.

(56) References Cited

U.S. PATENT DOCUMENTS

| | | | |
|---|---|---|---|
| 2003/0190419 A1 | 10/2003 | Katagami et al. | |
| 2006/0051498 A1* | 3/2006 | Katagami | B41J 2/2114 427/66 |
| 2011/0122193 A1* | 5/2011 | Sato | B41J 25/003 347/38 |
| 2014/0034994 A1 | 2/2014 | Yamane et al. | |

FOREIGN PATENT DOCUMENTS

| | | |
|---|---|---|
| JP | 09-39220 A | 2/1997 |
| JP | 2003-307612 A | 10/2003 |
| JP | 2005-296854 A | 10/2005 |
| JP | 2006-167559 A | 6/2006 |
| JP | 2010-005619 A | 1/2010 |
| JP | 2010-137148 A | 6/2010 |
| JP | 2015-066534 A | 4/2015 |
| JP | 2015066534 A * | 4/2015 |
| WO | 2010/100928 A1 | 9/2010 |
| WO | 2013/046545 A1 | 4/2013 |

OTHER PUBLICATIONS

JP2015-066534, machine translation (Year: 2015).*
Official Communication issued in International Patent Application No. PCT/JP2017/0161387, dated Jun. 20, 2017.

* cited by examiner

*Primary Examiner* — Robert A Vetere
(74) *Attorney, Agent, or Firm* — Keating & Bennett, LLP

(57) ABSTRACT

An application surface of a base material includes one or more heads provided with a plurality of nozzle holes configured to discharge the droplets and configured to move in a predetermined direction relative to the base material, and a rotation mechanism configured to change, when the application surface is regarded as a plane, a pitch between the plurality of nozzle holes in the predetermined direction by rotating the head with respect to a perpendicular line standing on the plane as a rotation axis.

10 Claims, 12 Drawing Sheets

MANUFACTURING METHOD

TECHNICAL FIELD

The disclosure relates to an application device configured to apply droplets to a target object, and more particularly relates to a production device for an electronic device including an organic film.

BACKGROUND ART

PTL 1 discloses an inkjet application device that corrects the angle of an inkjet head in order to improve the accuracy of the spraying location of droplets in inkjet application.

CITATION LIST

Patent Literature

PTL 1: JP 2010-137148 A (Published on Jun. 24, 2010).

SUMMARY

Technical Problem

In the inkjet application device of PTL 1, because the pitch of the nozzle holes with respect to the application direction is constant, streak-shaped application unevenness may occur in the applied droplets.

Solution to Problem

To solve the above-mentioned problems, an application device according to one aspect of the disclosure relates to an application device configured to apply droplets to an application surface of a target object, wherein the application device includes one or more heads provided with a plurality of nozzle holes configured to discharge the droplets and configured to move in a predetermined direction relative to the target object, and a rotation mechanism configured to change, when the application surface is regarded as a plane, a pitch between the plurality of nozzle holes in the predetermined direction by rotating the head with respect to a perpendicular line standing on the plane as a rotation axis.

Advantageous Effects of Invention

According to one aspect of the disclosure, it is possible to realize an application device configured to reduce streak-shaped application unevenness.

BRIEF DESCRIPTION OF DRAWINGS

FIG. 7A illustrates a case in which $\theta=0°$ and FIG. 7B illustrates a case in which $\theta=30°$.

FIG. 9A illustrates a first application step and FIG. 9B illustrates a second application step.

FIG. 11A illustrates a first application step and FIG. 11B illustrates a second application step.

FIG. 13A illustrates a forward path in the Y direction, FIG. 13B illustrates a return path in the Y direction, FIG. 13C illustrates a forward path in the X direction, and FIG. 13D illustrates a return path in the X direction.

DESCRIPTION OF EMBODIMENTS

An application device (film formation device) according to one aspect of the disclosure can be applied not only to the production of light emitting elements such as organic Electro Luminescence (EL) displays equipped with Organic Light Emitting Diodes (OLED) or inorganic EL displays equipped with inorganic light emitting diodes, but can also be applied to the production of Quantum Dot Light Emitting Diode (QLED) displays equipped with QLED. Because film formation can be performed without requiring a vacuum step, it is anticipated that productivity can be greatly improved in film formation devices. Hereinafter, an application device (film formation device) configured to produce organic EL devices equipped with OLED will be described as an example.

Figure 1A:
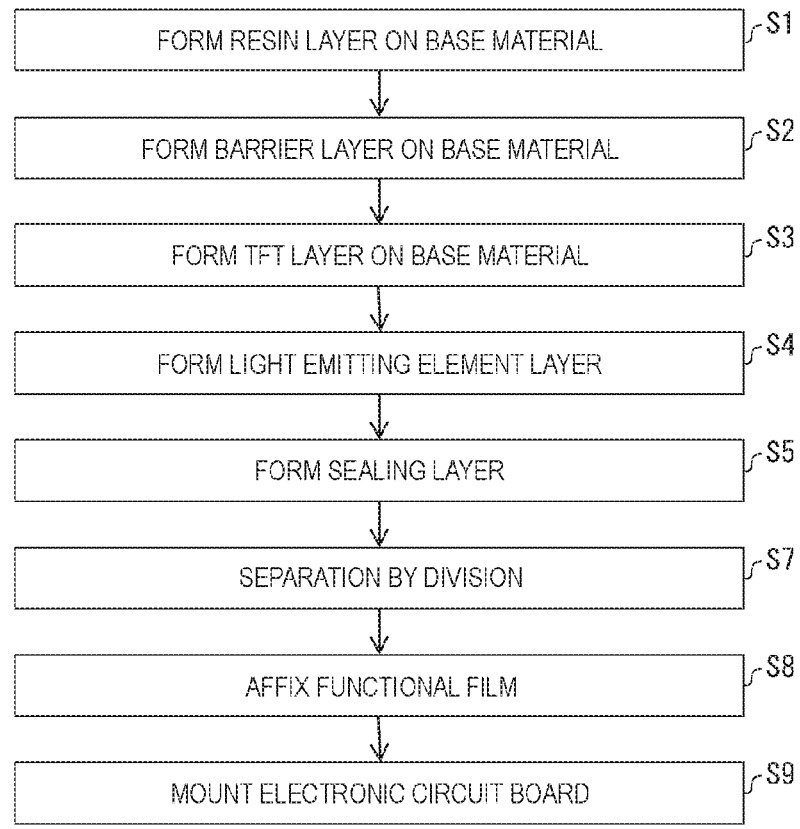
FIG. 1A is a flowchart illustrating an example of a method of producing an EL device.
Figure 1B:
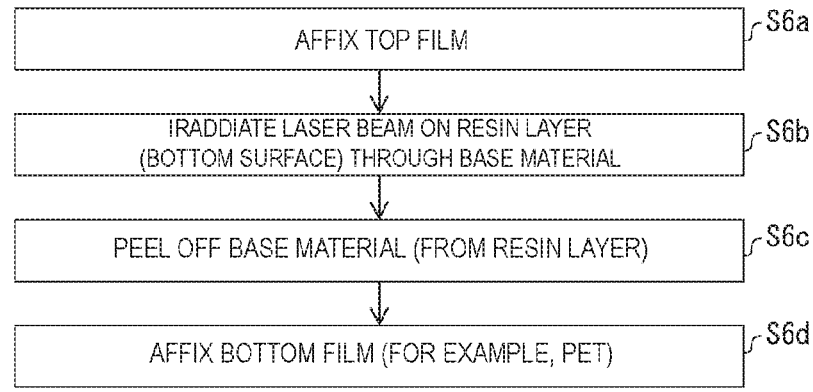
FIG. 1B is a flowchart illustrating an example of additional steps in a method of producing a flexible EL device.
Figure 2A:
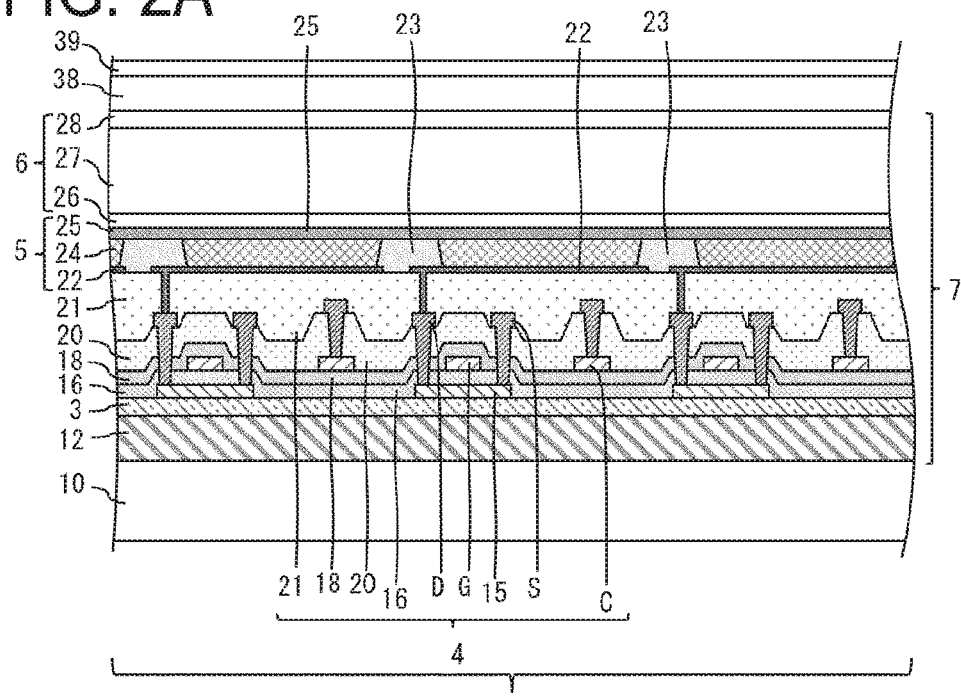
FIG. 2A is a cross-sectional view illustrating a configuration example of the EL device of the first embodiment.

FIG. 1A is a flowchart illustrating an example of a method of producing an EL device (electronic device), and FIG. 1B is a flowchart illustrating an example of additional steps in a method of producing a flexible EL device. FIG. 2A is a cross-sectional view illustrating a configuration example of the EL device of the first embodiment, and FIG. 2B is a cross-sectional view illustrating a configuration example during the process of producing the EL device of the first embodiment.

As illustrated in FIG. 1A and FIG. 2A, first, a resin layer 12 is formed on the base material 10 (Step S1). Next, a barrier layer 3 is formed (Step S2). Next, a TFT layer (thin film transistor layer) 4 including a gate insulating film 16, passivation films 18 and 20, and an organic interlayer film 21 is formed (Step S3). Next, a light emitting element layer (for example, OLED element layer) (light emitting element) 5 is formed (Step S4). Next, a sealing layer 6 including a first inorganic sealing film 26, a second inorganic sealing film 28, and an organic sealing film 27 (organic film) are formed to obtain a layered body 7 (Step S5). Next, the layered body 7 is divided and split into individual pieces along with the base material 10 (Step S7). Next, a functional film 39 is affixed via the adhesive layer 38 (Step S8). Next, an electronic circuit board is mounted on the end portion of the TFT layer 4 (Step S9). In this way, the EL device 2 illustrated in FIG. 2A is obtained. It should be noted that each of the above steps is performed by an EL device production device.

Figure 2B:
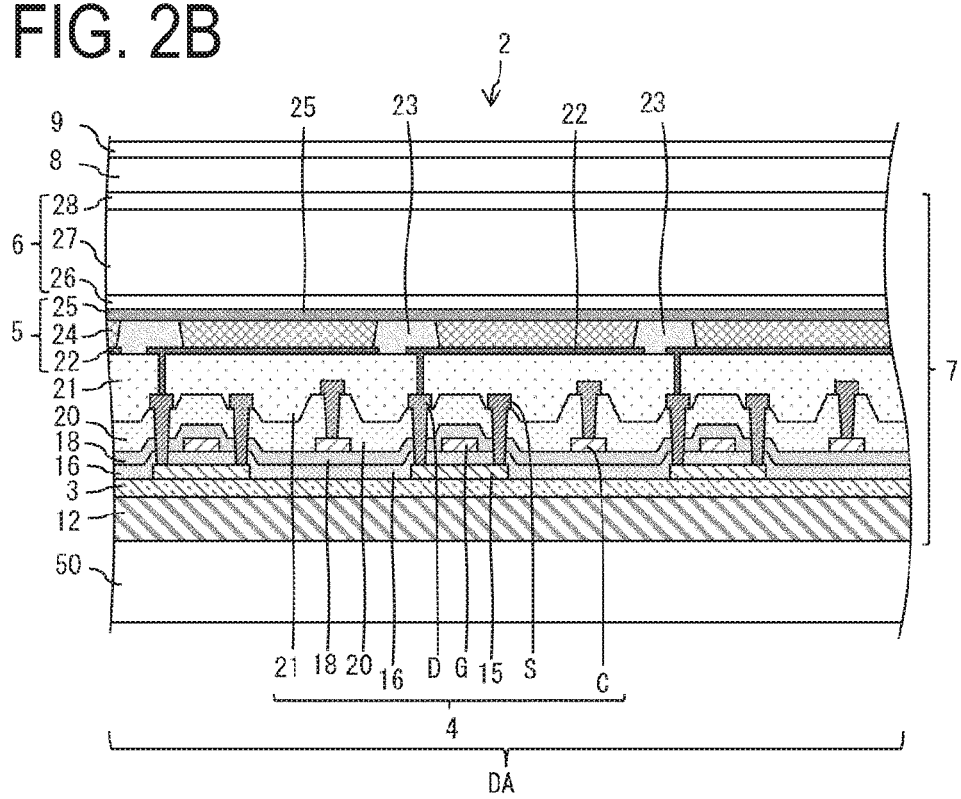
FIG. 2B is a cross-sectional view illustrating a configuration example during the process of producing the EL device of the first embodiment.

Note that, when producing the flexible EL device 2, as illustrated in FIG. 1B and FIG. 2B, for example, the layered body 7 (the resin layer 12, the barrier layer 3, the TFT layer 4, the light emitting element layer 5, and the sealing layer 6) is formed in advance on the glass base material 50 (Steps S1 to S5), and the upper film 9 is affixed on the layered body 7 via the adhesive layer 8 (Step S6a). Next, the lower surface of the resin layer 12 is irradiated with laser beam through the glass base material 50 (Step S6b). Here, the lower surface (the interface with the glass base material 50) of the resin layer 12 is altered by ablation, and the bonding force between the resin layer 12 and the glass base material 50 is reduced. Next, the glass base material 50 is peeled from the resin layer 12 (Step S6c). Subsequently, the base material 10 (for example, a lower surface film made of PET or the like) is attached to the lower surface of the resin layer 12 via an adhesive layer (S6d). Thereafter, the process may proceed to Step S7.

Examples of the material of the resin layer 12 include polymide, epoxy, and polyamide. As a material of the base material 10, for example, polyethylene terephthalate (PET) is exemplified.

The barrier layer 3 is a layer configured to prevent moisture and impurities from reaching the TFT layer 4 and/or the light emitting element layer 5 during usage of the EL device 2. The barrier layer 3 can be composed of, for example, a silicon oxide film, a silicon nitride film, a silicon oxynitride film, or a layered film thereof formed using a Chemical Vapor Deposition (CVD) method.

The TFT layer 4 may include a semiconductor film 15, a gate insulating film 16, a gate electrode G, passivation films 18 and 20, a capacitor electrode C and a terminal TM, a source electrode S and a drain electrode D, and an organic interlayer film (flattening film) 21. The gate insulating film 16 is formed above the semiconductor film 15. The gate electrode G is formed above the gate insulating film 16. The passivation films 18 and 20 are formed above the gate electrode G. The capacitor electrode C and the terminal TM are formed above the passivation film 18. The organic interlayer film 21 formed above the passivation film 20 is formed above the source electrode S and the drain electrode D. A thin film transistor (TFT) is configured to include the semiconductor film 15, the gate insulating film 16, and the gate electrode G. In the non-active region of the TFT layer 4, a plurality of terminals TM used for connection with the electronic circuit board are formed. Note that the active region corresponds to a region where the light emitting element layer 5 is formed (the region where the semiconductor film 15, the gate electrode G, the capacitor electrode C, the source electrode S, and the drain electrode D are formed), and may also be referred to as a display region. The non-active region is a region other than the active region, and is a region where a plurality of terminals TM used for connection with the electronic circuit board are formed.

The semiconductor film 15 is formed of, for example, low temperature polysilicon (LTPS) or an oxide semiconductor. The gate insulating film 16 can be composed of, for example, a silicon oxide (SiOx) film, a silicon nitride (SiNx) film, or a layered film thereof formed using a CVD method. The gate electrode G, the source electrode S, the drain electrode D, and the terminal are formed of a metal single layer film or a layered film including, for example, at least one of aluminum (Al), tungsten (W), molybdenum (Mo), tantalum (Ta), chromium (Cr), titanium (Ti), or copper (Cu). Note that although a TFT using the semiconductor film 15 as a channel is illustrated as a top gate structure in FIG. 2A and FIG. 2B, a bottom gate structure is also possible (for example, in the case where the channel of the TFT is an oxide semiconductor).

The gate insulating film 16 and the passivation films 18 and 20 can be composed of, for example, a silicon oxide (SiOx) film, a silicon nitride (SiNx) film, or a layered film thereof formed using a CVD method. The organic interlayer film 21 can be formed of a coatable photosensitive organic material, such as polymide or acrylic, for example. The edge of the terminal TM is covered with an organic interlayer film 21.

The light emitting element layer 5 (for example, the organic light emitting diode layer) may include a first electrode 22 (for example, an anode electrode) formed above the organic interlayer film 21, an organic insulating film 23 configured to cover an edge of the first electrode 22, an electroluminescent (EL) layer 24 formed above the first electrode 22, and a second electrode 25 formed above the EL layer 24. The first electrode 22, the EL layer 24, and the second electrode layer 25 constitute a light emitting element (for example, an organic light emitting diode). The organic insulating film 23 in the active region DA functions as a bank (pixel partition) that defines subpixels.

The organic insulating film 23 can be made of a coatable photosensitive organic material such as polymide or acrylic, for example. For example, the organic insulating film 23 can be applied to the active region DA and the non-active region NA by a slit coater method.

In the non-active region NA, a bank-shaped convex member TK surrounding the active region is provided. The convex member TK defines an edge of the organic sealing film 27. The convex member TK is configured to include, for example, at least one of the organic interlayer film 21 and the organic insulating film 23.

The EL layer 24 is formed in a region (subpixel region) surrounded by the partition 23c by vapor deposition or an ink-jet method. In the case where the light emitting element layer 5 is an organic light-emitting diode (OLED) layer, for example, the EL layer 24 is formed by layering a hole injecting layer, a hole transport layer, a light emitting layer, an electron transport layer, and an electron injecting layer from the lower layer side. Note that one or more layers of the EL layer 24 is a shared layer (shared by a plurality of pixels).

The first electrode (anode) 22 is formed by layering of, for example, Indium Tin Oxide (ITO) and an alloy including silver (Ag), and has light reflectivity. The second electrode (for example, a cathode electrode) 25 is a shared electrode, and is formed of a transparent metal such as Indium Tin Oxide (ITO) or Indium Zinc Oxide (IZO).

In the case where the light emitting element layer 5 is an OLED layer, holes and electrons are recombined in the EL layer 24 by the drive current between the first electrode 22 and the second electrode 25 and the excitons generated thereby fall to the ground state such that light is emitted.

The light emitting element layer 5 is not limited to OLED element configurations, and may be an inorganic light emitting diode or a quantum dot light emitting diode.

The sealing layer 6 covers the light emitting element layer 5 and prevents penetration of foreign matter, such as water and oxygen, into the light emitting element layer 5. The sealing layer 6 may include a a first inorganic sealing film 26 configured to cover the organic insulating film 23 and the second electrode 25, an organic sealing film 27 that functions as a buffer film and is formed above the first inorganic sealing film 26, and a second inorganic sealing film 28 configured to cover the first inorganic sealing film 26 and the organic sealing film 27.

Each of the first inorganic sealing film 26 and the second inorganic sealing film 28 is a silicon oxide film, a silicon nitride film, a silicon oxynitride film, or a layered film thereof formed by a CVD method using a mask. The organic sealing film 27 is a transparent organic insulating film that is thicker than the first inorganic sealing film 26 and the second inorganic sealing film 28, and is formed of a coatable photosensitive organic material such as polymide or acrylic. For example, an ink containing such an organic material is inkjet coated on the first organic sealing film 26, and subsequently cured by Ultra Violet (UV) radiation.

The functional film 39 may include, for example, an optical compensation function, a touch sensor function, a protection function, or the like. In a case where layers having one or more of these functions are layered above the light emitting element layer 5, the functional film 39 may be made thinner or removed. The electronic circuit board is, for example, an IC chip or a flexible printed circuit board (FPC) mounted on a plurality of terminals TM.

First Embodiment

Figure 3:
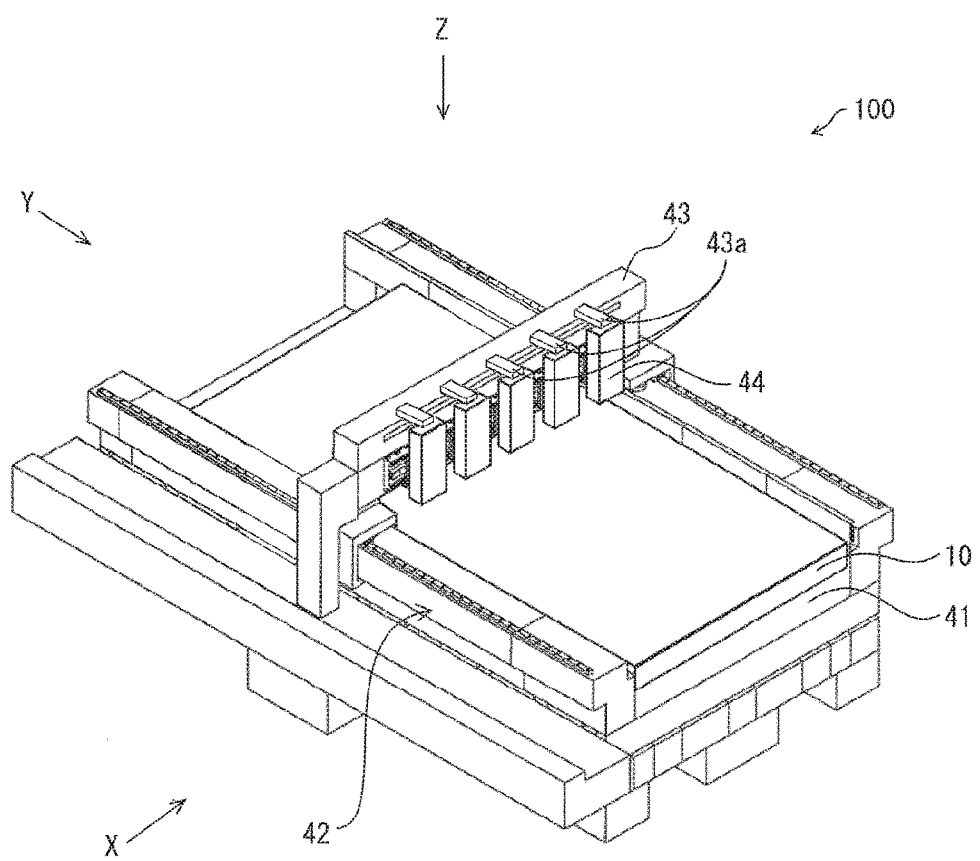
FIG. 3 is a perspective view illustrating an outer appearance of the application device according to the first embodiment.
Figure 4:
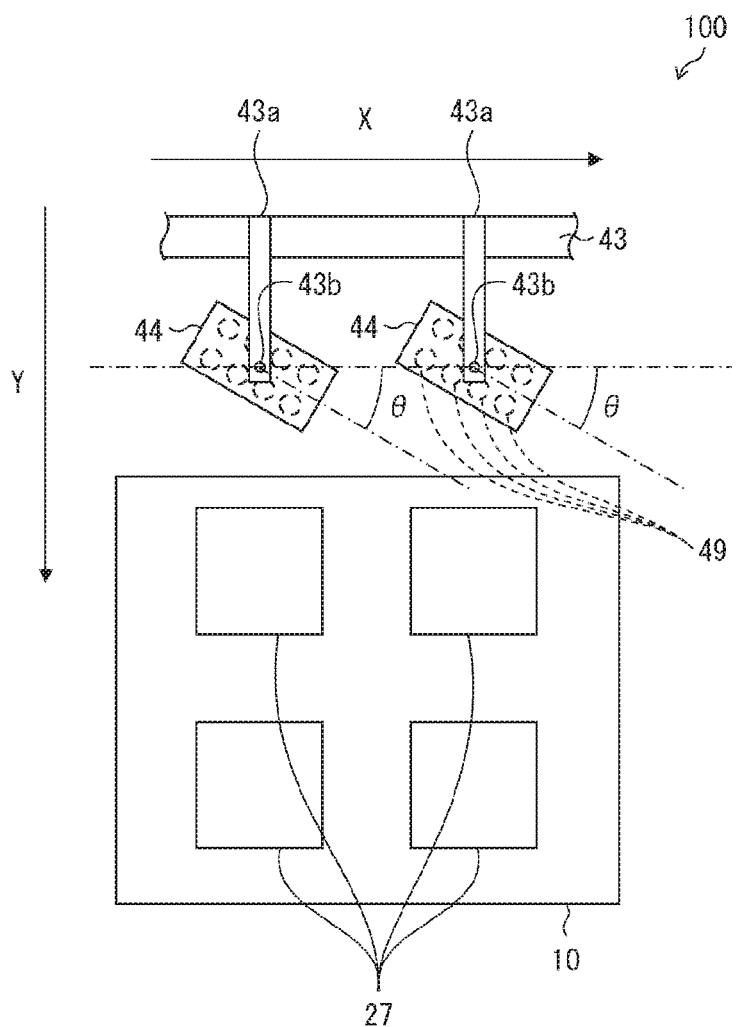
FIG. 4 is a top view illustrating a configuration of a primary component of the application device of the first embodiment.

FIG. 3 is a perspective view illustrating an outer appearance of the application device 100 according to the present embodiment. FIG. 4 is a top view illustrating a configuration of a primary component of the application device 100. The application device 100 is a film forming device configured to form an organic film (a thin film such as the organic sealing film 27) in an EL device (target object) 2 by ejecting droplets of ink (droplet material) in Step S5, as illustrated in FIGS. 1A and 1B, for example.

The application device 100 includes a stage 41 on which the base material 10 is placed as well as a gantry 43 that crosses above the stage 41. A plurality of heads 44 are mounted on the side face of the gantry 43 via an arm 43a. The head 44 has a substantially rectangular bottom surface, and a plurality of nozzle holes 49 configured to discharge droplets is provided on the bottom surface. In the example illustrated in FIG. 4, a total of eight nozzle holes 49 are provided, with four aligned in the direction parallel to the long side of the bottom surface and two in the direction parallel to the short side of each head 44. The number of the nozzle holes 49, however, is appropriately changed according to the shape of the region to which it is desirable to apply the droplets, the amount of droplets to be applied, or the like. In addition, the number of the nozzle holes 49 provided on each head 44 is not necessarily required to coincide with each other. Further the shape of the bottom surface of the head 44 is not necessarily approximately rectangular.

The gantry 43 is configured to move reciprocally along the Y direction (a predetermined direction) of FIG. 3 using the gantry slide mechanism 42 connected to the stage 41. As the gantry 43 moves relative to the stage 41, the head 44 also moves in the same direction relative to the base material 10. The plurality of in-production EL devices 2 is formed along the Y direction of the base material 10. The application device 100 may eject ink for each of the EL devices 2 being produced.

Note that the gantry slide mechanism 42 may include an encoder (not illustrated) based on a linear scale, and may acquire position coordinates in the main scanning direction (Y direction). The encoder is utilized for generation of a trigger signal for ejecting ink from the heads 44. For example, a case is considered in which the gantry 43 is scanned at a constant speed in the main scanning direction and the resolution of the encoder is 10 μm. In this case, by generating a pulse signal from the encoder, further dividing the pulse signal into 10 portions, generating a trigger signal, and ejecting ink from the heads 44 in synchronization with the trigger signal, it is possible to eject ink with an accuracy of 1 μm. In addition, the same can be applied to the sub scanning direction (X direction) to be described later.

Note that in the application device 100, the stage 41 on which the base material 10 is placed is configured to move with respect to the gantry 43. That is, in the application device 100, the head 44 may move relatively in a predetermined direction with respect to the base material 10.

The number of the heads 44 of the gantry 43 is not particularly limited, and configurations with just one head are also possible. However, to save time, the gantry 43 preferably has many heads 44. In the example illustrated in FIG. 3, five heads 44 are mounted on the gantry 43.

Figure 5:
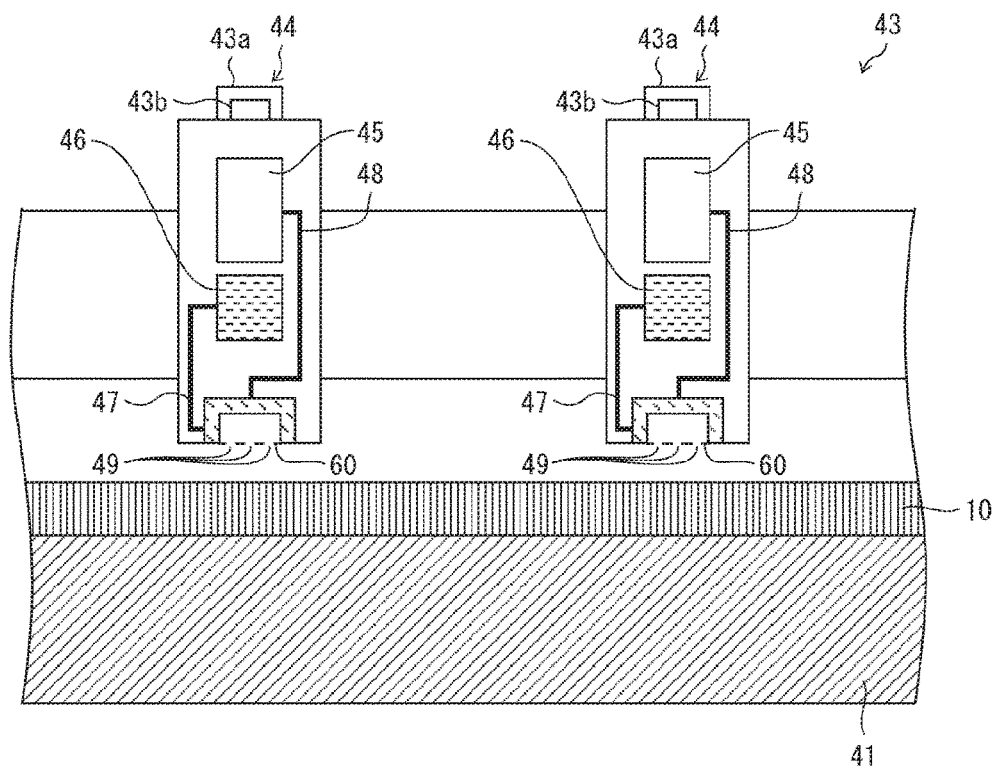
FIG. 5 is a cross-sectional view of a head provided in the application device of the first embodiment.

FIG. 5 is a cross-sectional view of a head 44 provided in the application device 100. As illustrated in FIG. 5, the head 44 includes an ink tank 45, an ink pipe 48, and a nozzle hole 49. In the head 44, ink is supplied from the ink tank 45 provided at the upper portion of the head 44 to the lower portion of the head 44 via the ink pipe 48 in accordance with a control signal output from the drive control circuit 46, and be ejected as droplets from the nozzle hole 49 toward the base material 10.

Figure 6:
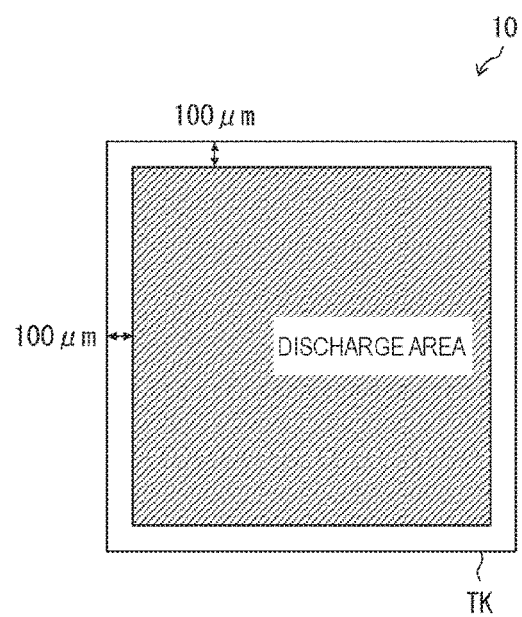
FIG. 6 is a plan view illustrating an example of a region where droplets are discharged.

FIG. 6 is a plan view illustrating an example of a region where droplets are discharged. For the sake of simplicity, the convex member TK is illustrated as a square border line in FIG. 6. The droplets are ejected to, for example, a part of the region partitioned by the convex member TK formed in the non-active region to leave a surrounding region of 100 μm. Ejection of droplets is initiated from the end of the region where droplets are ejected; that is, from a position 100 μm inward (on the active region side) from the convex member TK.

A rotation mechanism 43b is provided at a position where the arm 43a is connected to the head 44. When the application surface of the base material 10 is regarded as a plane, the rotation mechanism 43b is configured to change the pitch between the nozzle holes 49 in the X direction by rotating the head 44 with respect to a perpendicular line set on the plane as a rotation axis. The rotation mechanism 43b may, for example, be a drive motor having the above perpendicular line as a drive shaft.

In the present embodiment, when a straight line that is perpendicular to the Y direction and parallel to the application surface is taken as a reference line, the rotation mechanism 43b rotates the head 44 within a range of less than 90° from the reference line. In particular, for example, the rotation mechanism 43b rotates the head 44 within a range where the angle θ illustrated in FIG. 4 is greater than or equal to 0° and less than 90°. Thus, in the application device 100, it is possible to set the pitch between the nozzle holes 49 in the X direction to a desired pitch.

Among the directions in which the plurality of nozzle holes 49 are arranged, an arrangement direction along the X direction in the default state in which the heads 44 have not been rotated is referred to as the reference arrangement direction of the nozzle holes 49. The angle θ is an angle between the reference arrangement direction and the X direction. In the present embodiment, in the default state, it is assumed that four nozzle holes 49 are aligned in parallel in the X direction.

Figure 7A:
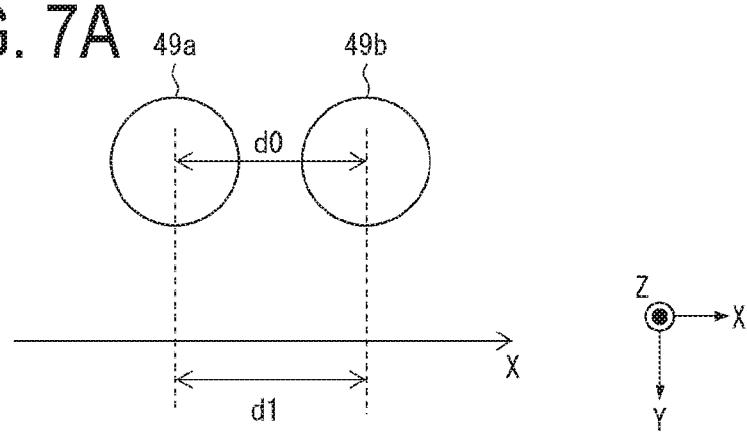
FIGS. 7A and 7B are diagrams illustrating the pitch in the X direction of nozzle holes arranged along a reference alignment direction, where
Figure 7B:
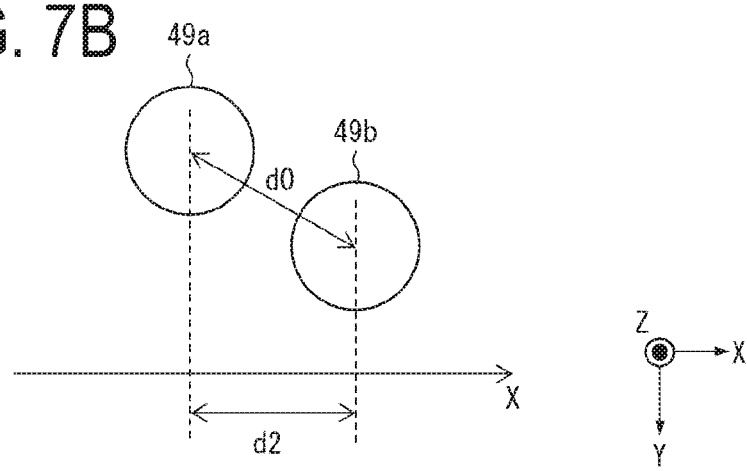

FIGS. 7A and 7B are diagrams illustrating the pitch in the X direction of the nozzle holes 49a and 49b arranged along the reference alignment direction, where FIG. 7A illustrates a case in which θ=0° and FIG. 7B illustrates a case in which θ=30°. The nozzle holes 49a and 49b are two mutually adjacent nozzle holes 49. As illustrated in FIG. 7A and FIG. 7B, the pitch between the nozzle holes 49a and 49b in the X direction is a distance between perpendicular lines drawn from straight lines parallel to the X direction from the centers of the nozzle holes 49a and 49b.

The pitch in the X direction may depend on the value of the angle θ formed by the reference arrangement direction and the X direction. For example, as illustrated in FIG. 7A, the pitch d1 in the X direction when θ=0° is equal to d0. In contrast, as illustrated in FIG. 7B, the pitch d2 in the X direction when θ=30° is shorter than d1 and is equal to d0×cos 30°. That is, the pitch of the nozzle holes 49a and 49b in the X direction is represented by d0×cos(θ). Accordingly, by rotating the head 44 by the rotation mechanism 43b and changing θ, the pitch of the nozzle holes 49 in the X direction can be changed.

In the present embodiment, a rotation mechanism 43b corresponding to each of the plurality of heads 44 is provided, and rotates each of the heads 44. Accordingly, in comparison with a case of rotating a large head, there is a high degree of freedom in adjusting the position of the nozzle holes 49, and the application device 100 can be made smaller.

In the present embodiment, the application device 100 may perform a plurality of application processes on the base material 10 using the same type of ink. Hereinafter, the two application processes performed by the application device 100 will be described in the order in which they are executed as a first application step and a second application step.

Figure 8A:
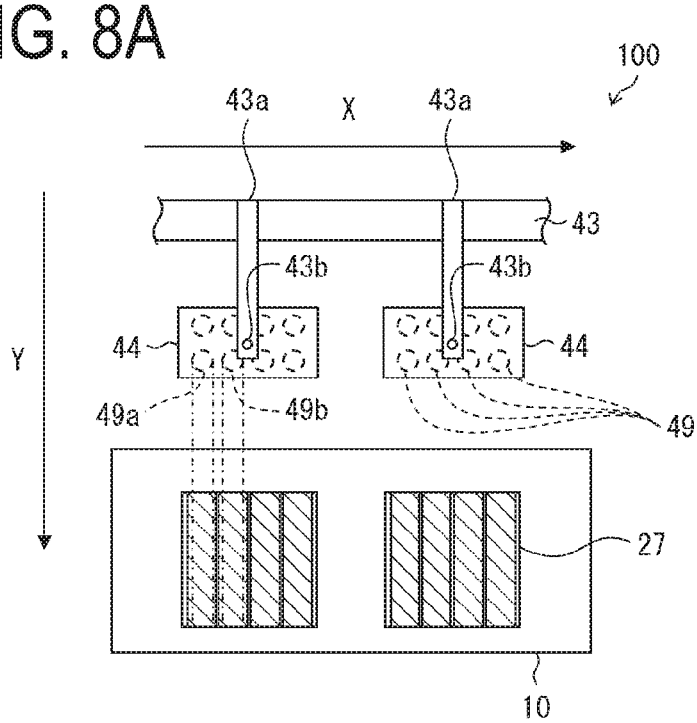
FIG. 8A is a diagram illustrating a first application step.

FIG. 8A is a diagram illustrating a first application step. In the first application step, the application device 100 applies droplets to the base material 10 in a state where the four nozzle holes 49 of the head 44 are arranged in parallel to the X direction (that is, in the state of θ=0° illustrated in FIG. 4). At the point of completion of the first application step, streak-shaped application unevenness parallel to the Y direction occurs among the applied droplets, as illustrated in FIG. 8A.

The rotation mechanism 43b makes the rotation angle of the head 44 in the first application step different from the rotation angle of the head 44 in the second application step. In other words, the rotation mechanism 43b rotates the head 44 between the first application step and the second application step. Further, in other words, the application method (thin film production method) performed by the application device 100 may include an angle modification step in which the rotation mechanism 43b differentiates the rotation angle of the head 44 in the first application step and the rotation angle of the head 44 in the second application step.

Figure 8B:
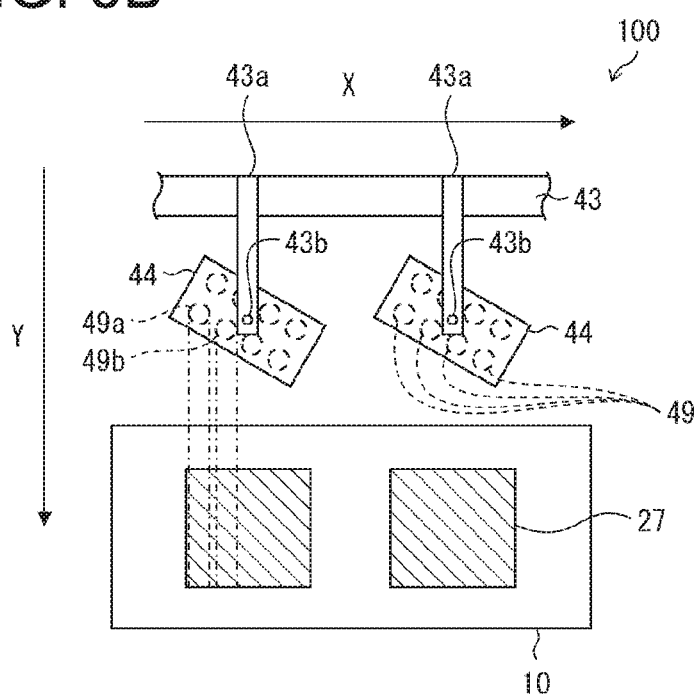
FIG. 8B is a diagram illustrating a second application step.

FIG. 8B is a diagram illustrating a second application step. In the second application step, the application device 100 applies droplets to the base material 10 in a state in which the reference arrangement direction in which the four nozzle holes 49 are aligned in the head 44 is inclined by 30° from a state parallel to the X direction (that is, in the state of θ=30° illustrated in FIG. 4). In the second application step, more droplets are applied to at least a portion of the location where droplets were not applied in the first application step.

Each of the application processes described above may be executed, for example, in the forward movement and the return movement of the head 44 reciprocating in the Y direction with respect to the base material 10. In particular, for example, the head 44 may execute the first application step in the process of moving in the forward direction of the arrow indicating the Y direction in FIG. 8A and FIG. 8B, and execute the second application step in the process of moving in the direction opposite to the arrow. Alternatively, after the first application step is executed in the process that the head 44 moves in the forward direction of the arrow indicating the Y direction, the head 44 may execute the second application step in the process of returning to the original position and moving in the forward direction of the arrow again. Note that in each of the above examples, it goes without saying that the forward direction and the reverse direction with respect to the arrow may be reversed.

The angle of the head 44 in each of the above-described application steps is an example, and may be appropriately changed to a suitable angle to reduce application unevenness. In addition, in each application step, the angles of the plurality of heads 44 need not necessarily be the same. Further, the application device 100 may carry out three or more application steps as necessary.

In addition, the rotation mechanism 43b may rotate the head 44 during an application step rather than between the respective application steps. Further, the application device 100 may further include a movement mechanism configured to move the head 44 in a direction perpendicular to the Y direction and in a direction parallel to the application surface of the base material 10 (X direction in FIG. 3) The movement mechanism may be provided, for example, on the gantry 43 side of the arm 43a. In this way, the degree of freedom of position adjustment of the nozzle hole 49 may be improved.

As described above, in the application device 100 according to the present embodiment, the head 44 is rotated by the rotation mechanism 43b to change the pitch (application pattern) between the nozzle holes 49 in the movement direction of the head 44. In this way, it is possible to reduce application unevenness of droplets on the application surface of the base material 10. In particular, in the application device 100, by performing the application process a plurality of times on the same base material 10 and changing the angle of the head 44 for each application step, it is possible to significantly reduce application unevenness of the droplets.

In addition, by forming the organic sealing film 27 in the EL device 2 using the application device 100, the difference in film thickness of the organic sealing film 27 is dispersed, and the film thickness becomes uniform. Accordingly, the yield of the EL devices 2 is improved.

In the above-described embodiment, although the application device 100 was described as a film formation device configured to form the organic sealing film 27, the application device 100 may instead be a device configured to form an organic film other than the organic sealing film 27 (for example, the organic insulating film 23). In addition, the application device 100 may be realized as a film formation device configured to form an organic film on the surface of a target application object other than the EL device 2.

Example 1

Figure 9A:
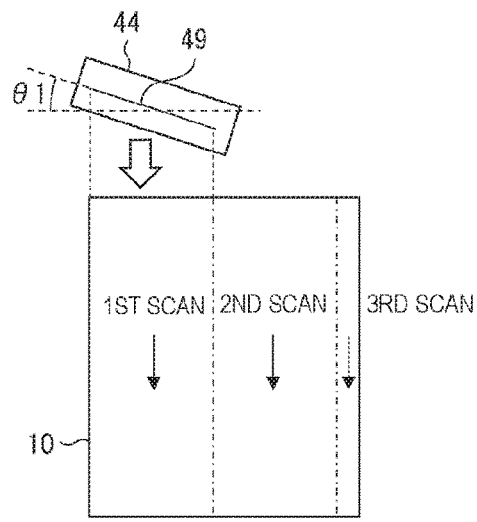
FIGS. 9A and 9B are diagrams illustrating an application method of Example 1 by the application device of the first embodiment, where
Figure 9B:
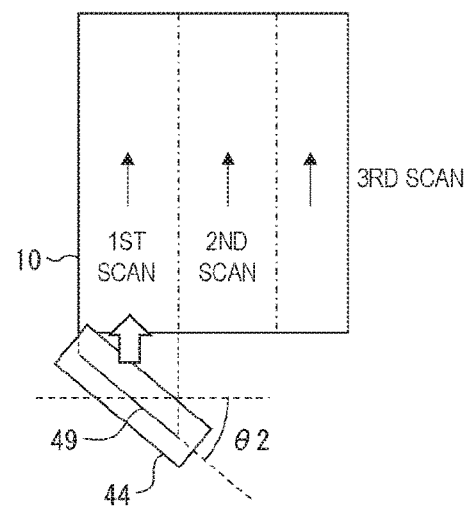

FIGS. 9A and 9B are diagrams illustrating an application method of Example 1 by the application device 100, where FIG. 9A illustrates a first application step and FIG. 9B illustrates a second application step. In FIG. 9A and FIG. 9B, for the sake of simplicity, it is assumed that the nozzle holes 49 are arranged in a line, and the line thereof is indicated by a straight line. In the present example, the head 44 reciprocates in the Y direction with respect to the base material 10, and each of the first application step and the second application step is alternatively executed in the forward and return paths of the reciprocating motion, respectively.

Specific examples of application by the application device 100 will be described below. In the present example, the head 44 reciprocates in the Y direction with respect to the base material 10. In addition, the application device 100 of this example further includes a movement mechanism configured to move the head 44 in the X direction.

First, in the forward path of the movement of the head 44, droplets are applied to the region of the "first scan" illustrated in FIG. 9A (first application step) in a state where the above-mentioned angle θ is set to θ1. Next, in the return path of the movement of the head 44, droplets are applied to the region of the "first scan" illustrated in FIG. 9B (second application step) in a state where the angle θ is set to θ2 (where θ2>θ1).

Next, the application device 100 moves the head 44 in the X direction and performs the first application process on the region of the "second scan" illustrated in FIG. 9A. Further, the application device 100 moves the head 44 again in the X direction and performs the second application process on the region of the "second scan" illustrated in FIG. 9B. Hereinafter, the movement distance of the head 44 of this embodiment will be described in the same manner for each of the first application step and the second application step. In the following description, the distance between the nozzle holes 49 at both ends in the X direction of the line of nozzle holes 49 on the head 44 is set as the scanning pitch. In particular, the scanning pitch in the first application step is set as a first scanning pitch, and the scanning pitch in the second application step is set as a second scanning pitch.

In the present example, when performing the first application step for the second or more times, the head 44 is moved in the X direction by the distance of the first scanning pitch, with the position of the head 44 in the immediately preceding first application step as a starting point. In addition, when performing the second application step for the second or more times, the head 44 is moved in the X direction by the distance of the second scanning pitch, with the position of the head 44 in the immediately preceding second application step as the starting point. Accordingly, the "first scan" region and the "second scan" region in each of FIG. 9A and FIG. 9B, respectively, are in contact with each other.

In the examples illustrated in FIG. 9A and FIG. 9B, by performing the first application step and the second application step three times each, application of droplets to the base material 10 is completed. According to the application method of the present example, gaps are not generated in the regions where droplets are applied in each scan, and droplet application unevenness can be reduced.

In addition, the angle θ2 of the head 44 in the second application step is larger than the angle θ1 of the head 44 in the first application step. Accordingly, the droplets can be more densely applied in the second application step in comparison with the first application step. Thus, even in a case where application unevenness occurs in the forward path (first application step) of the reciprocating motion of the head 44, the application unevenness can be reduced in the return path (the second application step).

Note that, normally, when changing from the second application step to the first application step; that is, when changing the angle of the head 44 from θ2 to θ1, the rotation mechanism 43b rotates the head 44 in a direction opposite to a direction when changing the angle from θ1 to θ2. In this case, the accuracy of the angle of the head 44 may be lowered due to the backlash of the motor.

Therefore, the application device 100 may initialize the rotation mechanism 43b when transitioning from the second application step to the first application step. This can suppress reduction in the accuracy of the angle of the head 44.

Figure 10:
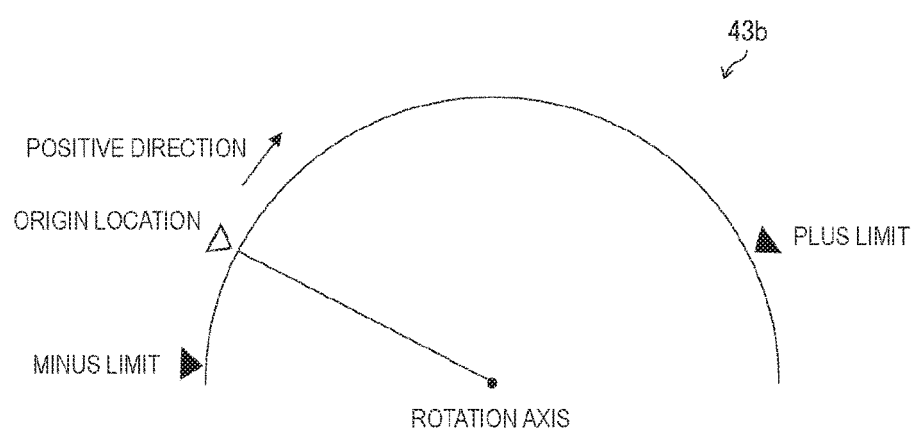
FIG. 10 is a diagram for describing initialization of a rotation mechanism.

FIG. 10 is a diagram for describing initialization of the rotation mechanism 43b. In FIG. 10, the rotation mechanism 43b rotates around the "rotation axis" perpendicular to the paper surface, with the direction in which θ increases taken as the positive direction.

In FIG. 10, the "plus limit" and the "minus limit" are physical markers that indicate limit angles to which the rotation mechanism 43b can physically rotate, respectively. Even in a case where the position of the above-mentioned markers deviates slightly, the rotation mechanism 43b rotates normally. In the case where the position of the above-mentioned markers deviates significantly, the position of the rotation axis shifts, and the rotation mechanism 43b cannot rotate normally. In addition, in FIG. 10, the "origin position" is a physical marker indicating an angle at which θ=0°. In contrast to the "plus limit" and the "minus limit," the "origin position" is strictly defined.

As described above, the "plus limit," the "minus limit," and the "origin position" are physical markers. Accordingly, the rotation mechanism 43b can recognize when the angle reaches the "plus limit," the "minus limit," and the "origin position."

Herein, initialization is an operation for positioning the origin position of the rotation mechanism 43b. In the initialization operation, first, the rotation mechanism 43b rotates relatively quickly in the negative direction. When the angle has reached the "origin position," the rotation mechanism 43 rotates in the positive direction from a position exceeding the angle at a speed slower than the above-mentioned rotation speed in the negative direction, and stops when the angle reaches the "origin position," thereby ending initialization.

In addition, in the event that the angle prior to starting initialization is on the negative side with respect to the "origin position," then the rotation mechanism 43b does not reach the "origin position," but instead reaches the "minus limit." In this case, the rotation mechanism 43b stops rotation in the negative direction at that point, and rotates in the positive direction. Subsequently, the rotation mechanism 43b performs the above-described initialization operation after passing the "origin position."

Example 2

An example of application by the application device 100 that is different from that of Example 1 will be described below. The present example differs from Example 1 in that the movement distances of the head 44 in the X direction for each of the first application step and the second application step are respectively shorter than the first scan pitch or the second scan pitch. That is, the application device 100 of the present example causes the head 44 to perform the reciprocating motion a plurality of times. Next, the application device 100 moves the head 44 in the X direction before the start of each forward path such that a portion of the region where droplets are applied in the forward path of the (N+1)th (where N is a natural number) reciprocating motion overlaps with the region where the droplets are applied in the forward path of the Nth reciprocating motion of the head 44. Further, the application device 100 moves the head 44 in the X direction before the start of each return path such that a portion of the region where droplets are applied in the return path of the (N+1)th reciprocating motion overlap with the region where droplets are applied in the return path of the Nth reciprocating motion of the head 44.

Figure 11A:
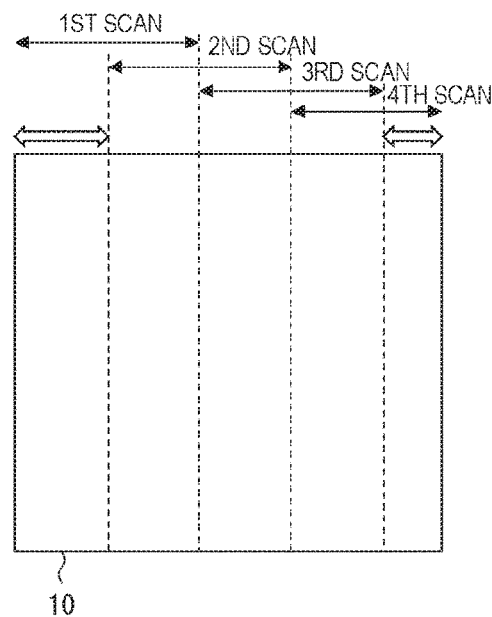
FIGS. 11A and 11B are diagrams illustrating an application method of Example 2 by the application device of the first embodiment, where
Figure 11B:
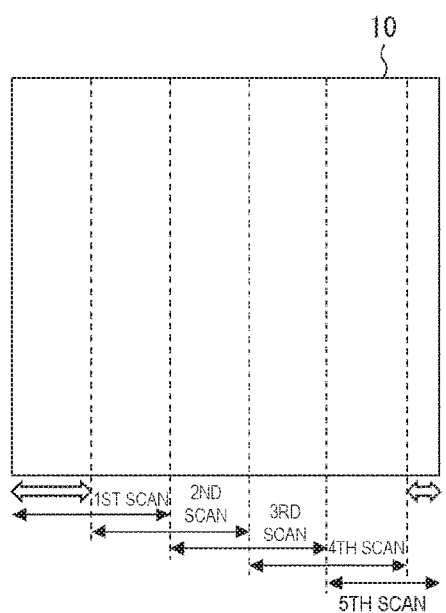

FIGS. 11A and 11B are diagrams illustrating an application method of Example 2 by the application device 100, where FIG. 11A illustrates a first application step and FIG. 11B illustrates a second application step. In the example illustrated in FIG. 11A, the first application step is executed four times, and the head 44 moves in the X direction by half of the first scanning pitch for each first application step. Accordingly, half of each region where droplets are applied in each first application step overlaps with the regions where droplets are applied in the immediately preceding or immediately following first application step. However, the droplets are not applied in an overlapping fashion to each half region (regions indicated by thick arrows in FIG. 11A) of those regions where droplets are applied in the first and fourth first application steps.

In addition, in the example illustrated in FIG. 11B, the second application step is executed five times, and the head 44 moves in the X direction by half of the second scanning pitch for each second application step. Accordingly, half of the regions where droplets are applied in each second application step overlaps with the regions where droplets are applied in the immediately preceding or immediately following second application step. However, the droplets are not applied in an overlapping fashion to each half region (regions indicated by thick arrows in FIG. 11B) of those regions where droplets are applied in the first and fifth second application steps.

In this case, among those regions where droplets are applied in the first application step, the application device 100 doubles the application amount of droplets in the first first application step for regions which do not overlap with regions where droplets are applied in the second first application step. In addition, among those regions where droplets are applied in the final first application step, the application device 100 doubles the application amount of droplets in the final first application step for regions which do not overlap with regions where droplets are applied in the immediately preceding first application step.

Figure 12A:
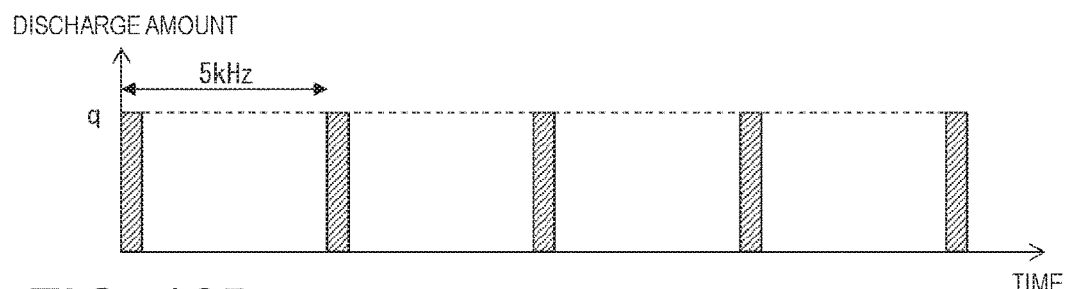
FIG. 12A is a graph showing a cycle of droplet discharge in a region where droplets are applied in an overlapping fashion.
Figure 12B:
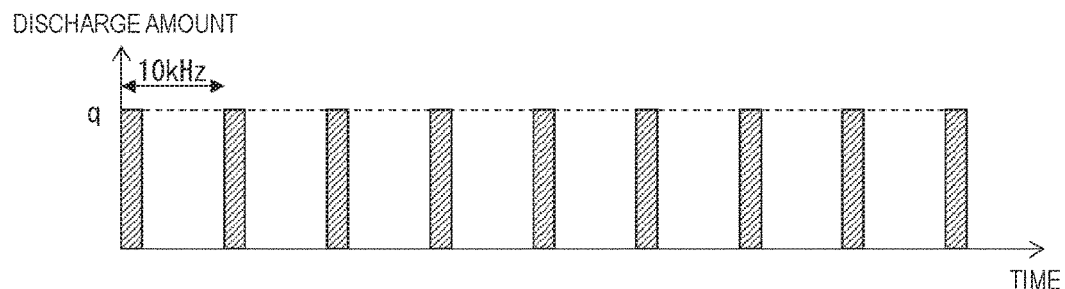
FIG. 12B is a graph showing a cycle of droplet discharge in a region where droplets are not applied in an overlapping fashion.

FIG. 12A is a graph showing a cycle (frequency) of droplet discharge in a region where droplets are applied in an overlapping fashion, and FIG. 12B is a graph showing a cycle (frequency) of droplet discharge in a region where droplets are not applied in an overlapping fashion. In FIGS. 12A and 12B, the horizontal axis represents time and the vertical axis represents the discharge amount of the droplets.

As illustrated in FIG. 12A, in regions where droplets are applied in an overlapping fashion, the head 44 discharges droplets at, for example, 5 kHz. In contrast, as illustrated in FIG. 12B, in regions where droplets are not applied in an overlapping fashion, the head 44 discharges droplets at, for example, 10 kHz. The discharge amount of droplets in one discharge is set to be constant (q in FIG. 12A and FIG. 12B) for any region. As a result, the amount of droplets applied per unit area is constant in both regions where the droplets are applied in an overlapping fashion and regions where the droplets are not applied in an overlapping fashion.

It should be noted that the head 44 may change the discharge amount instead of the discharge frequency of the droplets. For example, the frequency of discharge may be made constant in overlappingly applied regions and non-overlappingly applied regions, and each discharge amount in non-overlappingly applied regions may be made double that of the discharge amount in overlappingly applied regions.

In addition, the head 44 does not necessarily need to set the discharge amount or discharge frequency of the droplets such that the application amount of the droplets per unit area is constant. In the head 44, the discharge amount or the discharge frequency may be configured such that the difference in the application amount of the droplets per unit area is reduced in at least the overlappingly applied region and the non-overlappingly applied region. In other words, it may be sufficient for the head 44 to set the discharge amount or the discharge frequency of the droplets such that the amount of droplets applied to regions with a lesser number of overlapping applications is greater than the amount of liquid droplets applied to other regions.

In addition, among the regions where droplets are applied by the first scan, a zeroth scan in which droplets are applied only to those regions that do not overlap with regions where droplets are applied by the second scan may be executed before the above-described first scan. Also, among the regions where droplets are applied by the fourth scan (or the fifth scan), a fifth scan (or a sixth scan) in which droplets are applied only to those regions that do not overlap with regions where droplets are applied by the third scan (or the fourth scan) may be executed after the above-described fourth scan (or the fifth scan). In this case, the discharge frequency and the discharge amount of the droplets can be made constant regardless of the region.

According to the application method of Example 2, application unevenness can be further suppressed in comparison with the application method of Example 1.

Example 3

An example of an application method by the application device 100 that is different from that of Examples 1 and 2 will be described below. In the present example, the application device 100 applies droplets to the base material 10 by both reciprocating motions in the Y direction (main scanning) and reciprocating motions in the X direction (sub scanning).

Figure 13A:
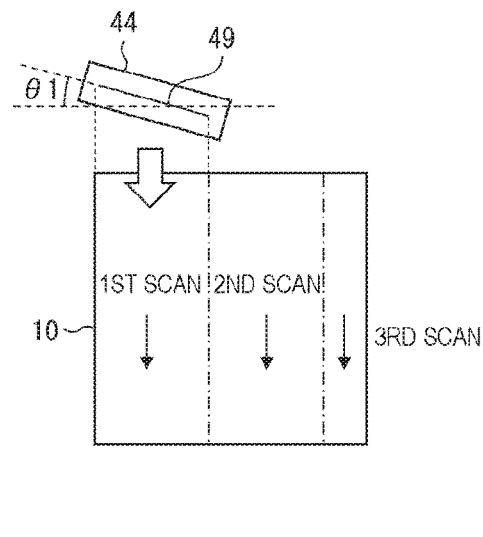
FIGS. 13A to 13D are diagrams illustrating an application method of Example 3 by the application device of the first embodiment, where
Figure 13B:
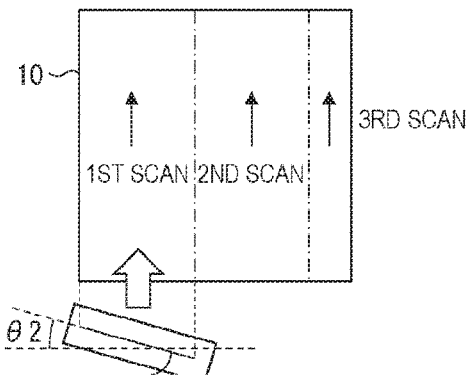
Figure 13C:
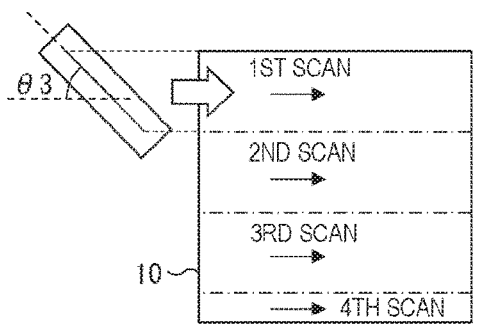
Figure 13D:
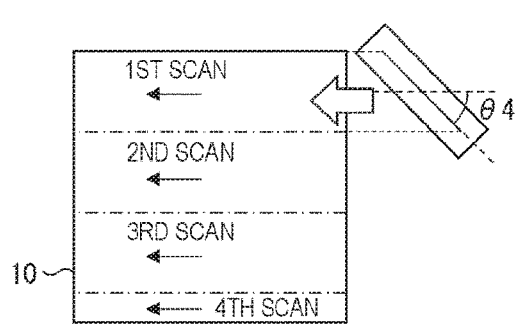

FIGS. 13A to 13D are diagrams illustrating an application method of Example 3 by the application device 100, where FIG. 13A illustrates a forward path in the Y direction, FIG. 13B illustrates a return path in the Y direction, FIG. 13C illustrates a forward path in the X direction, and FIG. 13D illustrates a return path in the X direction.

For the sake of simplicity, as in FIG. 9A and FIG. 9B, in FIG. 13A and FIG. 13B, it is assumed that the nozzle holes 49 are arranged in a line, and the line thereof is indicated by a straight line.

As illustrated in FIG. 13A and FIG. 13B, in the main scan of the application device 100, the angles of the head 44 in the forward path and return path are set to θ1 and θ2, respectively. In the present example, θ1=θ2. In contrast, as illustrated in FIG. 13C and FIG. 13D, in the sub scan of the application device 100, the angles of the head 44 in the forward path and return path are set to θ3 and θ4, respectively. In the present embodiment, θ3=θ4. In this case, the application process in the forward and return paths of the main scan is the first application step, and the application process in the forward and return paths of the sub scan is the second application step.

According to the application method of Example 3, application unevenness can be further suppressed in comparison with the application method of Example 2.

It should be noted that θ1 and θ2 may be different from each other between the forward path and the return path of the main scan, and θ3 and θ4 may be different from each other between the forward path and the return path of the sub scan. That is, in the application device 100 of the present embodiment, as in the case of Example 2 described above and the like, the head 44 may perform the first application step and the second application step in each of the forward path and the return path of the reciprocating motion (first reciprocating motion) of the head 44 in the Y direction. Further, in the application device 100, in addition to the above-described reciprocating motion in the Y direction, the head 44 may perform a reciprocating motion (second reciprocating motion) that moves in the X direction with respect to the base material 10, and further execute a third application step of applying droplets in the forward path of the reciprocating motion that operates in the X direction and a fourth application step of applying droplets in the return path. In this case as well, application unevenness can be further reduced and the droplets can be uniformly applied in comparison with the case where the head 44 reciprocates only in the Y direction to apply the droplets.

In this case, it is preferable that the angles of the head 44 in each of the first application process to the fourth application process be such that θ1≤θ2≤θ3≤θ4. By setting the angles of the head 44 as described above, there is the advantage that the rotation direction of the rotation mechanism 43b can be made constant when transitioning from the forward path to the reverse path in the main scan and the sub scan, and also that the width of the application region in each scan is not excessively narrowed.

Second Embodiment

Figure 14:
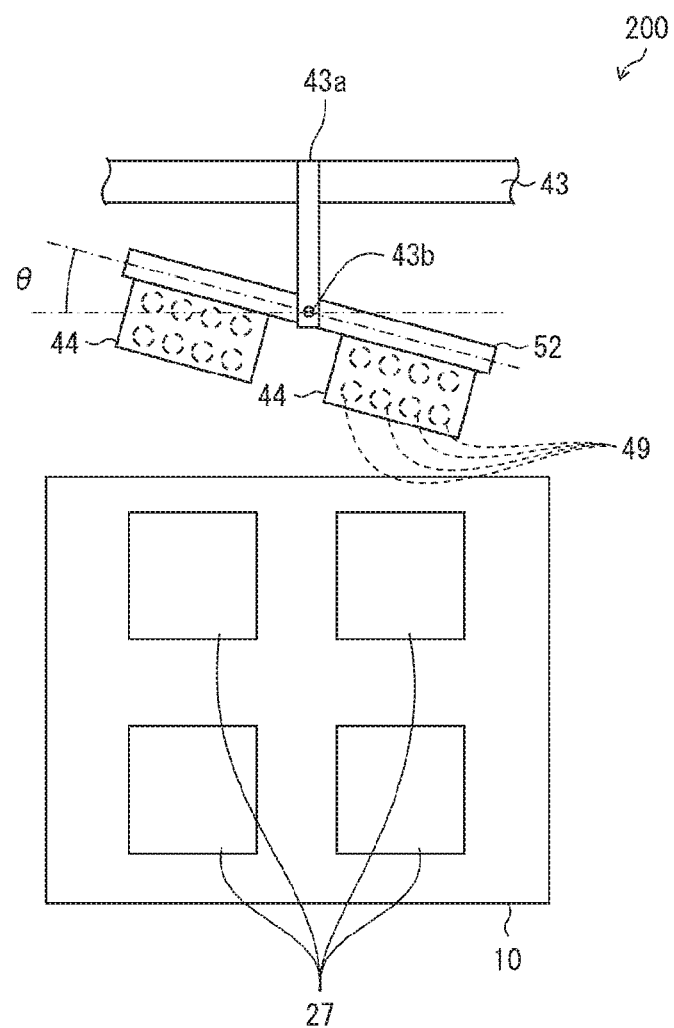
FIG. 14 is a top view illustrating a configuration of a primary component of the application device of a second embodiment.

FIG. 14 is a plan view illustrating the outline of an application device 200 according to the present embodiment. As illustrated in FIG. 14, in addition to each member included in the application device 100, the application device 200 further includes a head unit 52 on which a plurality of heads 44 are mounted. In the application device 200, the plurality of heads 44 are attached to the gantry 43 via the arm 43a and the head unit 52.

In addition, the application device 200 includes a single rotation mechanism 43b regardless of the number of heads 44. In the application device 200, the rotation mechanism 43b rotates the head unit 52, rather than the heads 44, with a perpendicular line standing on the application surface as the rotation axis. That is, the rotation mechanism 43b of the application device 200 rotates the plurality of heads 44 as a single unit.

The application device 200 achieves the same effects as that of the application device 100. In addition, in the application device 200, the number of rotation mechanisms can be reduced and the structure of the device can be simplified in comparison with the application device 100.

Third Embodiment

Figure 15:
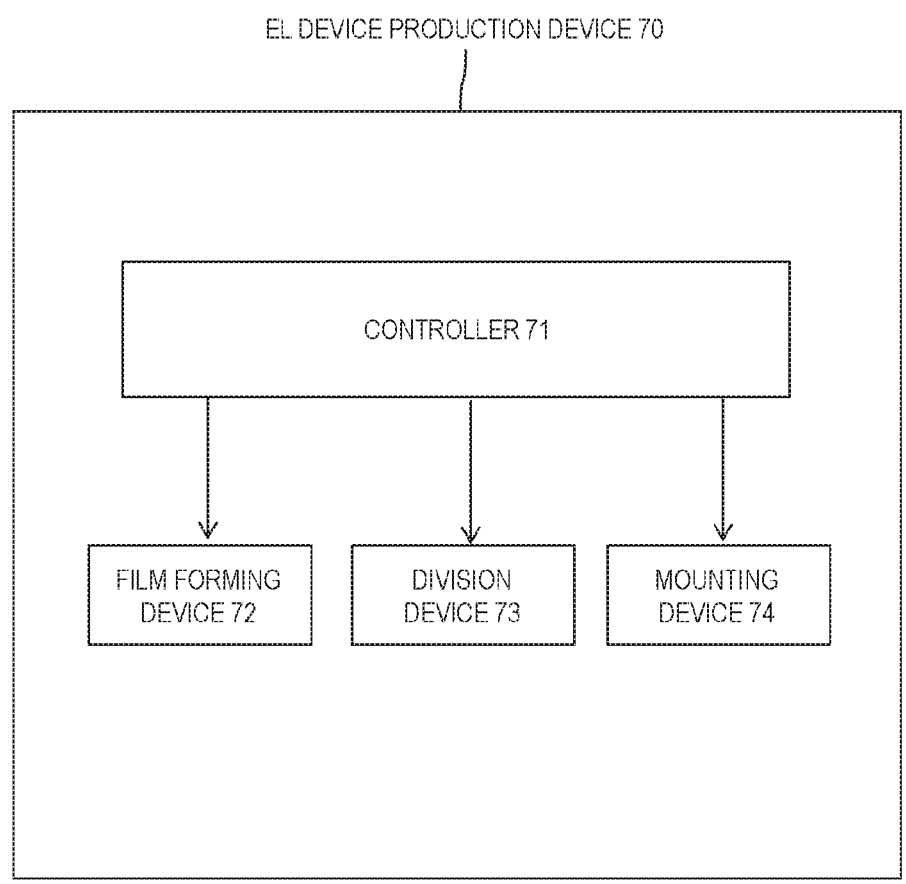
FIG. 15 is a block diagram illustrating a configuration of an EL device production device of a third embodiment.

FIG. 15 is a block diagram illustrating a configuration of an EL device production device (electronic device production device) 70 according to the present embodiment. As illustrated in FIG. 15, the EL device production device 70 includes a film formation device 72, a partition device 73, a mounting device 74, and a controller 71 configured to control these devices. As one of the film formation devices 72, the application device 100 is included in the EL device production device 70. The application device 100 controlled by the controller 71 performs the processes of Step S5 in FIGS. 1A and 1B.

In this way, the EL device production device 70 including the application device 100, as well as the EL device 2 produced by the EL device production device 70, are included in the technical scope of the disclosure.

Supplement

An application device of a first aspect relates to an application device configured to apply droplets to an application surface of a target object, the application device including one or more heads provided with a plurality of nozzle holes configured to discharge the droplets and configured to move in a predetermined direction relative to the target object, and a rotation mechanism configured to change, when the application surface is regarded as a plane, a pitch between the plurality of nozzle holes in the predetermined direction by rotating the head with respect to a perpendicular line standing on the plane as a rotation axis.

In a second aspect, the head performs multiple application processes on the identical target object using the identical type of droplet material, and the rotation mechanism causes a rotation angle of the head in a first application step to be different from the rotation angle of the head in a second application step.

In a third aspect, a straight line that is perpendicular to the predetermined direction and is parallel to the plane is set as a reference line, and the rotating mechanism rotates the head within a range of less than 90° from the reference line.

In a fourth aspect, a plurality of the heads are provided, and the rotation mechanism rotates each of the plurality of heads.

In a fifth aspect, a plurality of the heads are provided, and the rotation mechanism rotates the plurality of heads as a single unit.

In a sixth aspect, the target object includes a thin film transistor layer, a light emitting element, and an inorganic sealing film formed on the light emitting element, and an organic film is formed by discharging droplets onto the inorganic sealing film.

An electronic device production device of a seventh aspect includes the application device according to any of the first to sixth aspects.

An electronic device of an eighth aspect is produced by the electronic device production device according to the seventh aspect.

An application method of a ninth aspect relates to a method of producing a thin film by applying droplets to an application surface of a target object with an application device, the application device including one or more heads provided with a plurality of nozzle holes configured to discharge the droplets and configured to move in a predetermined direction relative to the target object, and a rotation mechanism configured to change, when the application surface is regarded as a plane, a pitch between the plurality of nozzle holes in the predetermined direction by rotating the head with respect to a perpendicular line standing on the plane as a rotation axis, the method including a first application step and a second application step in which the identical type of droplet material is applied to the identical target object by the head, and an angle modification step in which the rotation mechanism causes a rotation angle of the head in the first application step to be different from a rotation angle of the head in the second application step.

The disclosure is not limited to each of the embodiments stated above, and various modifications may be implemented within a range not departing from the scope of the claims. Embodiments obtained by appropriately combining technical approaches stated in each of the different embodiments also fall within the scope of the technology of the disclosure. Moreover, novel technical features may be formed by combining the technical approaches stated in each of the embodiments.

REFERENCE SIGNS LIST

2 EL device (target object, electronic device)
4 TFT layer (thin film transistor layer)
5 Light emitting element layer (light emitting element)
26, 28 Inorganic sealing film
27 Organic sealing film (Organic film)
43b Rotation mechanism
44 Head
49, 49a, 49b Nozzle hole
70 EL device manufacturing device (electronic device manufacturing device)
100, 200 Application device

The invention claimed is:

1. A method of producing a thin film by applying droplets to an application surface of a target object with an application device,
the application device including:
one or more heads provided with a plurality of nozzle holes configured to discharge the droplets and configured to move in a predetermined direction relative to the target object; and
a rotation mechanism configured to change, when the application surface is regarded as a plane, a pitch between the plurality of nozzle holes in the predetermined direction by rotating the head with respect to a perpendicular line standing on the plane as a rotation axis,
the method comprising:
a first application step and a second application step in which an identical type of droplet material is applied to an identical target object by the head; and
an angle modification step in which the rotation mechanism causes a rotation angle of the head in the first application step to be different from a rotation angle of the head in the second application step,
wherein the head moves in a reciprocating motion along the predetermined direction with respect to the target object,
the first application step is performed in a forward path of the reciprocating motion,
the second application step is performed in the return path of the reciprocating motion,
a straight line perpendicular to the predetermined direction and parallel to the plane is set as a reference line,
when rotation angles of the head with respect to the reference line in the first application step and the second application step are respectively θ1 and θ2, the relationship of the rotation angles is θ2>θ1,
the first application step and the second application step are alternately performed, and
the rotation mechanism is initialized at a transition time from the second application step to the first application step.

2. The method according to claim 1,
wherein the head performs, in addition to the reciprocating motion, a second reciprocating motion that moves in a direction perpendicular to the predetermined direction with respect to the target object, and
the method further comprising:
a third application step of applying droplets in the forward path of the second reciprocating motion; and
a fourth application step of applying droplets in the return path of the second reciprocating motion.

3. A method of producing a thin film by applying droplets to an application surface of a target object with an application device,
the application device including:
one or more heads provided with a plurality of nozzle holes configured to discharge the droplets and configured to move in a predetermined direction relative to the target object; and
a rotation mechanism configured to change, when the application surface is regarded as a plane, a pitch between the plurality of nozzle holes in the predetermined direction by rotating the head with respect to a perpendicular line standing on the plane as a rotation axis,
the method comprising:
a first application step and a second application step in which an identical type of droplet material is applied to an identical target object by the head; and
an angle modification step in which the rotation mechanism causes a rotation angle of the head in the first application step to be different from a rotation angle of the head in the second application step,
wherein the head moves in a reciprocating motion along the predetermined direction with respect to the target object,
the first application step is performed in a forward path of the reciprocating motion,
the second application step is performed in the return path of the reciprocating motion,
the reciprocating motion is executed a plurality of times,
the head is moved in a direction perpendicular to the predetermined direction prior to the start of each of the forward and return paths such that a portion of a region applied in the forward path of a second reciprocating motion overlaps with a region applied in the forward path of a first reciprocating motion, and a portion of the region applied in the return path of the second reciprocating motion overlaps with a region applied in the return path of the first reciprocating motion, and
the discharge amount or discharge frequency of the droplets are configured such that an amount of droplets applied to a region with a small number of overlapping application times is greater than an amount of droplets applied to other regions.

4. The method according to claim 3,
wherein the head performs, in addition to the reciprocating motion, a second reciprocating motion that moves in a direction perpendicular to the predetermined direction with respect to the target object, and
the method further comprising:

a third application step of applying droplets in the forward path of the second reciprocating motion; and a fourth application step of applying droplets in the return path of the second reciprocating motion.

5. The method according to claim 4, wherein a straight line perpendicular to the predetermined direction and parallel to the plane is set as a reference line; and when rotation angles of the head with respect to the reference line in each of the first application step, the second application step, the third application step, and the fourth application step are respectively θ1, θ2, θ3, and θ4, the relationship of the rotation angles is θ1≤θ2≤θ3≤θ4.

6. The method according to claim 3, wherein the first application step and the second application step are alternately performed, and the rotation mechanism is initialized at a transition time from the second application step to the first application step.

7. The method according to claim 3, wherein a straight line perpendicular to the predetermined direction and parallel to the plane is set as a reference line, and when the rotation angles of the head with respect to the reference line in each of the first application step and the second step are θ1 and θ2, the relationship of the rotation angles is θ2>θ1.

8. A method of producing a thin film by applying droplets to an application surface of a target object with an application device, the application device including:

one or more heads provided with a plurality of nozzle holes configured to discharge the droplets and configured to move in a predetermined direction relative to the target object; and a rotation mechanism configured to change, when the application surface is regarded as a plane, a pitch between the plurality of nozzle holes in the predetermined direction by rotating the head with respect to a perpendicular line standing on the plane as a rotation axis, the method comprising:

a first application step and a second application step in which an identical type of droplet material is applied to an identical target object by the head; and an angle modification step in which the rotation mechanism causes a rotation angle of the head in the first application step to be different from a rotation angle of the head in the second application step, wherein the head moves in a reciprocating motion along the predetermined direction with respect to the target object, the first application step is performed in a forward path of the reciprocating motion, the second application step is performed in the return path of the reciprocating motion, the head performs, in addition to the reciprocating motion, a second reciprocating motion that moves in a direction perpendicular to the predetermined direction with respect to the target object; and the method further comprising:

a third application step of applying droplets in the forward path of the second reciprocating motion; and a fourth application step of applying droplets in the return path of the second reciprocating motion.

9. The method according to claim 8, wherein a straight line that is perpendicular to the predetermined direction and is parallel to the plane is set as a reference line, and when the rotation angles of the head with respect to the reference line in each of the first application step and the second step are θ1 and θ2, the relationship of the rotation angles is θ2>θ1.

10. The method according to claim 8, wherein a straight line that is perpendicular to the predetermined direction and is parallel to the plane is set as a reference line, and when rotation angles of the head with respect to the reference line in each of the first application step, the second application step, the third application step, and the fourth application step are respectively θ1, θ2, θ3, and θ4, the relationship of the rotation angles is θ1≤θ2≤θ3≤θ4.

* * * * *